(12) United States Patent
Hong

(10) Patent No.: US 8,217,508 B2
(45) Date of Patent: Jul. 10, 2012

(54) METHOD OF PACKAGING INTEGRATED CIRCUIT DEVICES USING PREFORMED CARRIER

(75) Inventor: Tan Kwang Hong, Singapore (SG)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 12/704,423

(22) Filed: Feb. 11, 2010

(65) Prior Publication Data

US 2010/0148351 A1  Jun. 17, 2010

Related U.S. Application Data

(62) Division of application No. 11/277,292, filed on Mar. 23, 2006, now Pat. No. 7,682,869.

(51) Int. Cl.
*H01L 23/02* (2006.01)
(52) U.S. Cl. .................. 257/690; 257/E23.18
(58) Field of Classification Search .................. 257/690, 257/E23.18
See application file for complete search history.

(56) References Cited

U.S. PATENT DOCUMENTS

| | | | |
|---|---|---|---|
| 5,907,151 | A | 5/1999 | Gramann et al. |
| 6,088,901 | A | 7/2000 | Huber et al. |
| 6,288,904 | B1 | 9/2001 | Houdeau et al. |
| 6,582,994 | B2 | 6/2003 | Jiang et al. |
| 6,770,961 | B2 | 8/2004 | Lee |
| 6,984,544 | B2 | 1/2006 | Cloud et al. |
| 2002/0006686 | A1 | 1/2002 | Cloud et al. |
| 2003/0107126 | A1 | 6/2003 | Joshi |
| 2005/0258537 | A1 | 11/2005 | Huang et al. |
| 2007/0225852 | A1 | 9/2007 | Hong |

*Primary Examiner* — Alexander Ghyka
*Assistant Examiner* — Stanetta Isaac
(74) *Attorney, Agent, or Firm* — Perkins Coie LLP (57) ABSTRACT

Disclosed is a method of packaging integrated circuit devices using a preformed carrier. In one illustrative embodiment, the method includes providing a carrier having a plurality of pockets formed therein, positioning an integrated circuit chip and a substrate in each of the plurality of pockets and conductively coupling the integrated circuit chip and the substrate in each of the plurality of pockets to one another. Also disclosed is a packaged integrated circuit device including a preformed body and an integrated circuit chip and a substrate positioned within the preformed body, the integrated chip and the substrate being conductively coupled to one another.

17 Claims, 6 Drawing Sheets

METHOD OF PACKAGING INTEGRATED CIRCUIT DEVICES USING PREFORMED CARRIER

CROSS-REFERENCE TO RELATED APPLICATION

This application is a divisional of U.S. application Ser. No. 11/277,292 filed Mar. 23, 2006, now U.S. Pat. No. 7,682,869, which is incorporated herein by reference in its entirety.

BACKGROUND OF THE INVENTION

1. Field of the Invention

The present invention generally relates to the field of packaging integrated circuit devices, and, more particularly, to a method of packaging integrated circuit devices using a preformed carrier.

2. Description of the Related Art

Microelectronic devices generally have a die (i.e., a chip) that includes integrated circuitry having a high density of very small components. In a typical process, a large number of die are manufactured on a single wafer using many different processes that may be repeated at various stages (e.g., implanting, doping, photolithography, chemical vapor deposition, plasma vapor deposition, plating, planarizing, etching, etc.). The die typically include an array of very small bond pads electrically coupled to the integrated circuitry. The bond pads are the external electrical contacts on the die through which the supply voltage, signals, etc. are transmitted to and from the integrated circuitry. The die are then separated from one another (i.e., singulated) by backgrinding and cutting the wafer. After the wafer has been singulated, the individual die are typically "packaged" to couple the bond pads to a larger array of electrical terminals that can be more easily coupled to the various power supply lines, signal lines and ground lines.

Electronic products require packaged microelectronic devices to have an extremely high density of components in a very limited space. For example, the space available for memory devices, processors, displays and other microelectronic components is quite limited in cell phones, PDAs, portable computers and many other products. As such, there is a strong drive to reduce the height of a packaged microelectronic device and the surface area or "footprint" of a microelectronic device on a printed circuit board. Reducing the size of a microelectronic device is difficult because high performance microelectronic devices generally have more bond pads, which result in larger ball/grid arrays and thus larger footprints.

There are many techniques of packaging integrated circuit devices. Most involve conductively coupling a substrate, e.g., a printed circuit board, an interposer, etc., to the integrated circuit chip using a plurality of wire bonds. Thereafter, the chip and substrate are positioned in a mold and an injection molding process is typically performed to encapsulate the chip and the substrate in an encapsulant material, e.g., molding compound, epoxy, etc. The process described above, while acceptable in many applications, still suffers from said drawbacks. For example, products may have to be scrapped due to problems encountered in the molding process, e.g., voids. Moreover, the process described above may be very labor-intensive in that it requires that the molding apparatus be frequently cleaned.

The present invention is directed to a device and various methods that may solve, or at least reduce, some or all of the aforementioned problems.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

The present invention is generally directed to a method of packaging integrated circuit devices using a preformed carrier. In one illustrative embodiment, the method comprises providing a carrier having a plurality of pockets formed therein, positioning an integrated circuit chip and a substrate in each of the plurality of pockets and conductively coupling the integrated circuit chip and the substrate in each of the plurality of pockets to one another.

In another illustrative embodiment, the method comprises providing a carrier having a plurality of pockets formed therein, each of the pockets including a first recess and a second recess. The method further comprises, for each of the pockets, positioning an integrated circuit chip in the first recess and positioning a substrate in the second recess and conductively coupling the integrated circuit chip and the substrate in each of the plurality of pockets to one another.

The present invention is also directed to a packaged integrated circuit device. In one illustrative embodiment, the device comprises a preformed body having an integrated circuit chip and a substrate positioned within the preformed body, the integrated chip and the substrate being conductively coupled to one another.

In another illustrative embodiment, the device comprises a preformed body comprising a first recess and a second recess, an integrated circuit chip positioned in the first recess, a substrate positioned within the second recess and a plurality of wire bonds conductively coupled to the integrated circuit chip and the substrate.

BRIEF DESCRIPTION OF THE DRAWINGS

The invention may be understood by reference to the following description taken in conjunction with the accompanying drawings, in which like reference numerals identify like elements, and in which.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Various regions and structures of a packaged integrated circuit device are depicted in the drawings. For purposes of clarity and explanation, the relative sizes of the various features depicted in the drawings may be exaggerated or reduced as compared to the size of those features or structures on real-world packaged devices. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be explicitly set forth in the specification in a definitional manner that directly and unequivocally provides the special definition for the term or phrase.

Figure 1:
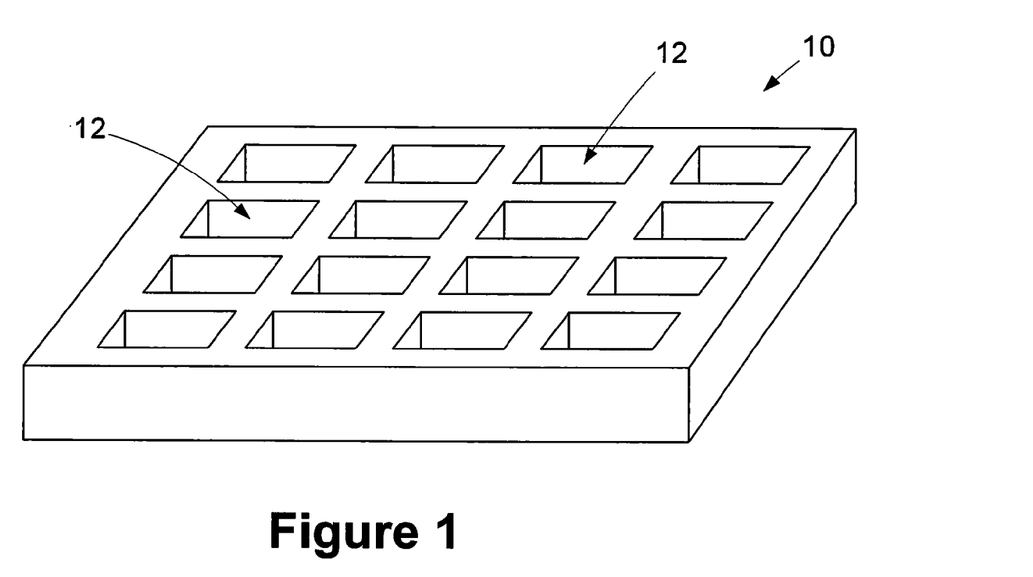
FIG. 1 is a perspective view of one illustrative embodiment of a premolded chip carrier in accordance with one illustrative aspect of the present invention.
Figure 2:
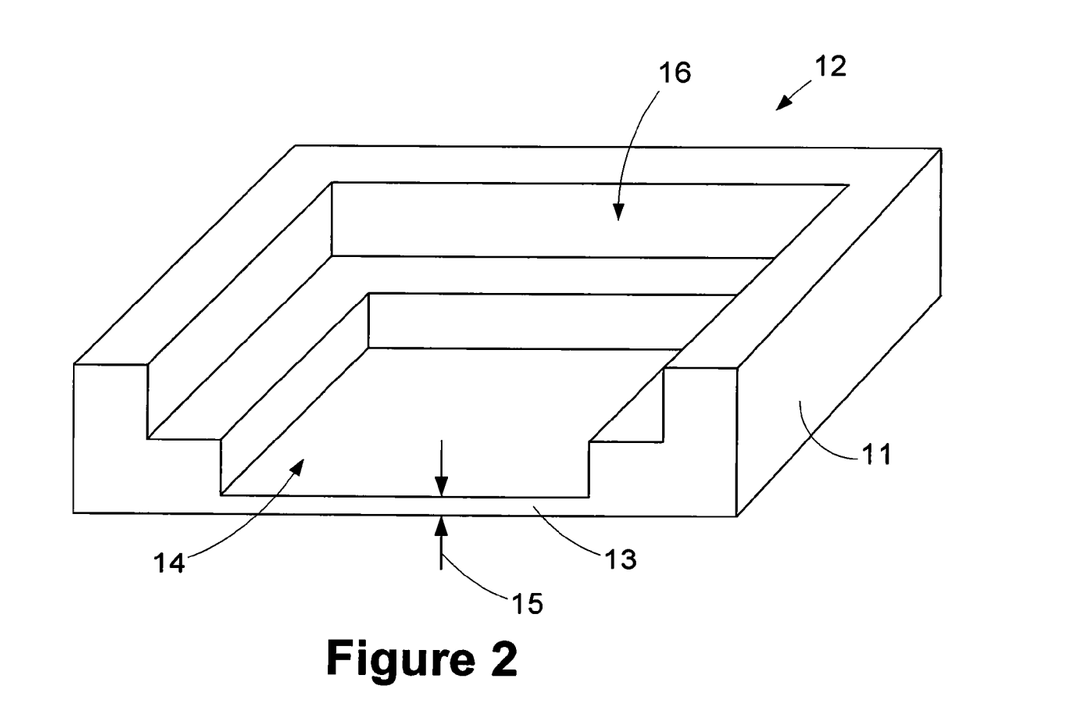
FIG. 2 is a perspective, cross-sectional view of an illustrative pocket, a plurality of which may be formed in the carrier depicted in FIG. 1.

FIG. 1 is a perspective view of one illustrative embodiment of a premolded carrier 10 with a plurality of preformed pockets 12 for integrated circuit chips in accordance with one aspect of the present invention. The carrier 10 may be formed by a variety of known techniques, e.g., transfer or injection molding. FIG. 2 is a cross-sectional, perspective view of one of the illustrative pockets 12 depicted in FIG. 1. As shown in FIG. 2, the illustrative pockets 12 depicted herein comprise a body 11 having a first recess or pocket 14 that is adapted to receive an integrated circuit (IC) chip and a second recess or pocket 16 that is adapted to have a substrate positioned therein. The body 11 further comprises a mold cap 13 having a thickness 15 that may vary depending upon the particular application. For example, the thickness 15 may range from approximately 0.1-0.2 mm. Typically, laser masking on the mold cap 13 will require that the thickness 15 be at least about 0.05 mm. However, if laser masking is not required, the thickness 15 may be less than that value. After a complete reading of the present application, those skilled in the art will appreciate that the present invention has broad applicability and thus should not be considered to be limited to the illustrative embodiments disclosed herein. For example, the size, number and configuration of the preformed pockets 12 and the recesses 14, 16 formed in the carrier 10 may vary depending upon the particular application. In the illustrative embodiment depicted in FIG. 1, the carrier 10 contains sixteen illustrative pockets 12, although more or less may be provided in practicing the present invention. Additionally, the size and configuration of the first and second recesses 14, 16 may also vary depending upon the particular application. Thus, the illustrative examples depicted herein should not be considered a limitation of the present invention.

Figure 3:
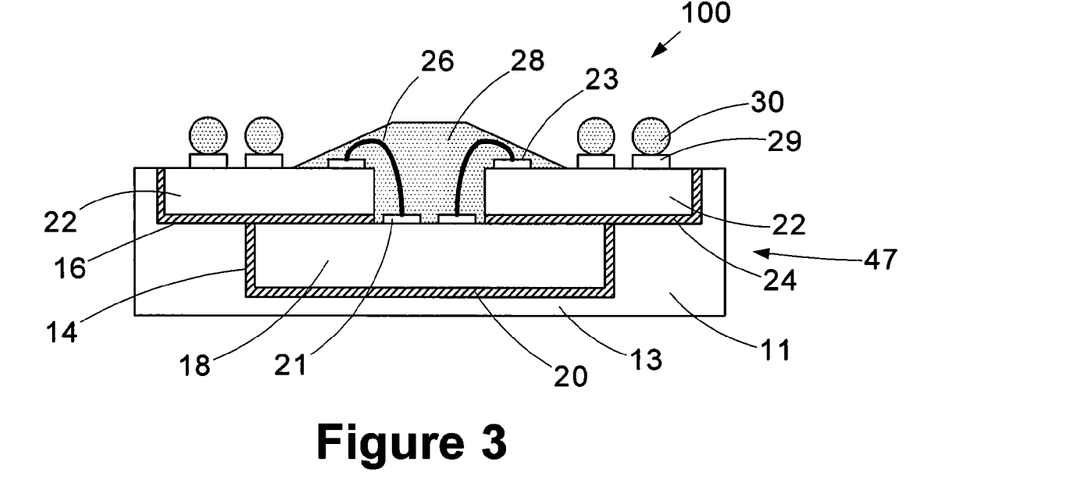
FIG. 3 is a cross-sectional view depicting one illustrative embodiment of a packaged integrated circuit device in accordance with one embodiment of the present invention.
Figure 4:
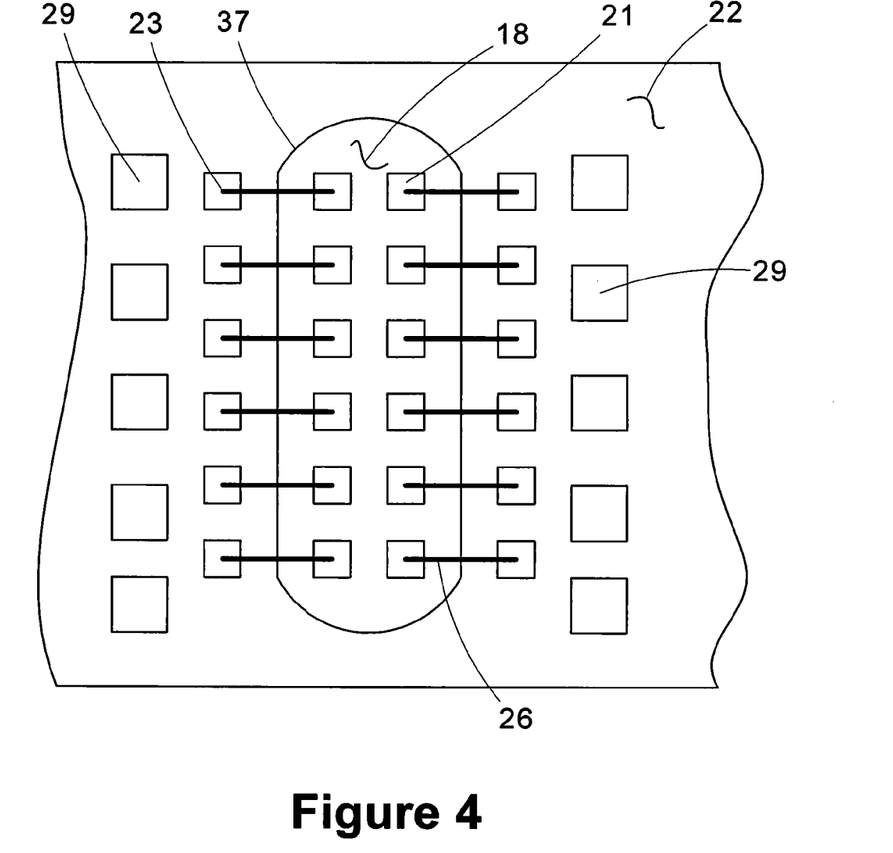
FIG. 4 is a plan view depicting one illustrative technique for conductively coupling an integrated circuit chip and a substrate in accordance with one illustrative aspect of the present invention.

FIG. 3 is a cross-sectional view of a packaged integrated circuit device 100 in accordance with one aspect of the present invention. FIG. 4 is a partial plan view of the device depicted in FIG. 3. As shown in these drawings, an integrated circuit (IC) chip or die 18 is secured within the first recess 14 by adhesive material 20, and a substrate 22 is secured within the second recess 16 by adhesive material 24. Of course, the present invention may be employed with any type of integrated circuit device, e.g., a memory device, a microprocessor, an application specific integrated circuit (ASIC), etc. More than one integrated circuit chip may also be positioned in the first recess 14 depending upon the particular application. The substrate 22 may be any type of structure that is commonly connected to an IC chip 18. For example, the substrate 22 may be an interposer, a printed circuit board, flex tape, a silicon interposer, etc. The adhesive material 20, 24 may be an adhesive paste or an adhesive tape which are both well known in the art. A plurality of wire bonds 26 are conductively coupled to bond pads 21 on the IC chip 18 and to bond pads 23 on the substrate 22 using known wire attach techniques. As seen in FIG. 4, a slot 37 is formed in the substrate 22 to allow attachment of the wire bonds 26 to the underlying IC chip 18.

An encapsulant material 28 is formed to over the wire bonds 26 and associated bond pads 21, 23. The encapsulant material 28 may be any of a variety of materials, e.g., epoxy or molding compound, and it may be formed using a variety of techniques, e.g., injection or transfer molding. Also depicted in FIG. 3 are a plurality of solder balls 30 that are coupled to bond pads 29 formed on the substrate 22 using known techniques. Ultimately, the solder balls 30 may be employed to conductively couple the packaged integrated circuit device to a structure (not shown), such as a printed circuit board, a motherboard, a module board, etc., using known techniques.

Figure 5A:
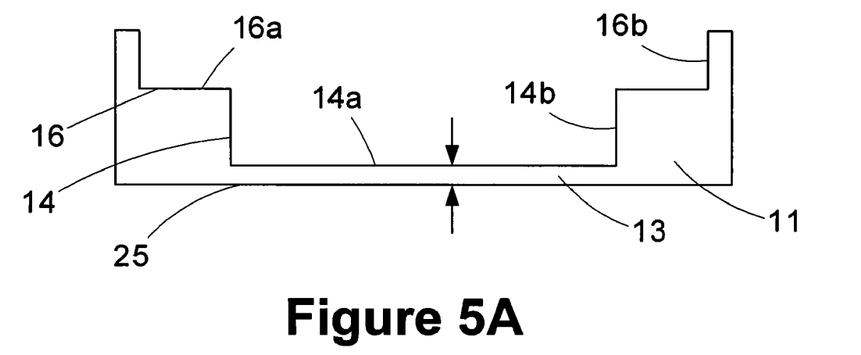
FIGS. 5A-5I depict one illustrative process flow that may be practiced in forming a packaged integrated circuit device in accordance with one aspect of the present invention.

One illustrative process flow for forming a packaged integrated circuit device 100 in accordance with the present invention will now be described with reference to FIGS. 5A-5I. FIG. 5A depicts one illustrative pocket 12 that is initially formed as part of the carrier 10. As shown therein, the pocket 12 comprises a first recess 14 and a second recess 16. In the depicted embodiment, the first recess 14 is defined by a bottom surface 14a and sidewalls 14b, and the second recess 16 is defined by a ledge 16a and sidewalls 16b. Of course, the shape and configuration of the first and second recesses 14, 16 may vary depending upon the particular application.

Figure 6:
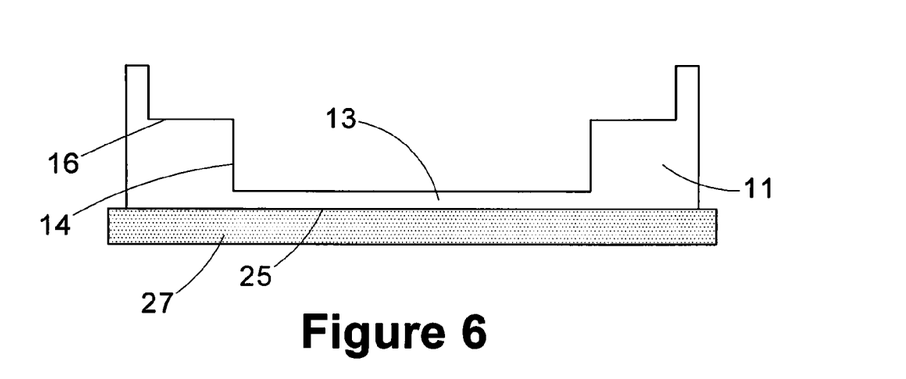
FIG. 6 is a cross-sectional view depicting an optional external support structure that may be employed with the present invention.

As indicated previously, the thickness 15 of the mold cap 13 may vary depending upon the particular application. For many applications, the mold cap 13 may be sufficiently thick to withstand the rigors of the packaging process. In some case, it may be desirable to add an optional additional external support structure 27 (see FIG. 6) to reduce or eliminate the chances of the mold cap 13 cracking or breaking during the chip packaging process. For example, this external support structure 27 may be a tape carrier that is adhesively coupled to the bottom surface 25 of the mold cap 13. The physical size, e.g., thickness, of the external support structure 27 may be varied to provide sufficient support to the mold cap 13 for the anticipated loading conditions to be experienced during the packaging process. For ease of explanation, the optional external support structure 27 will not be depicted in any additional drawings so as not to obscure the present invention.

Figure 5B:
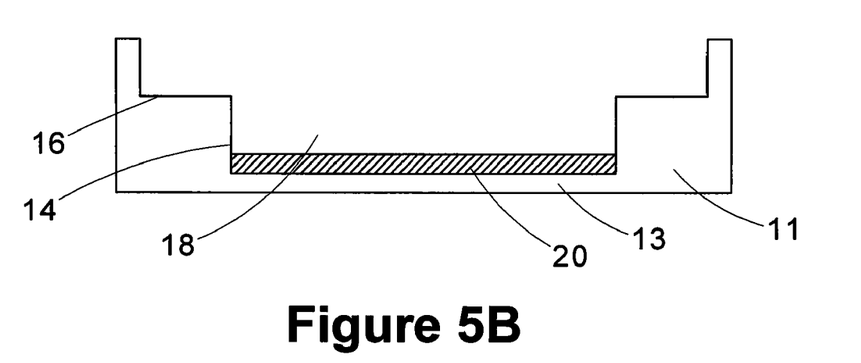
Figure 5C:
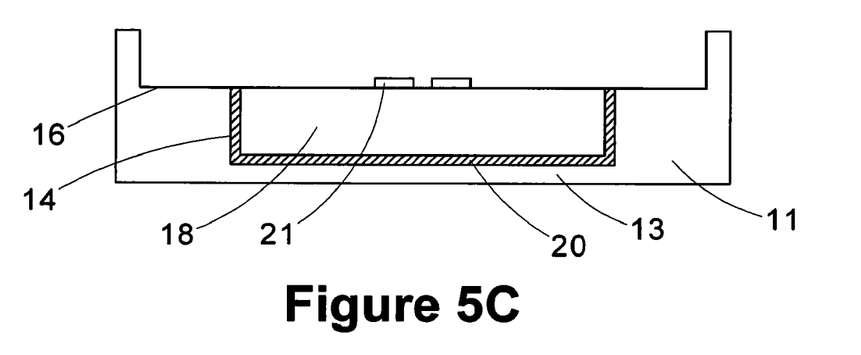

In FIG. 5B, an adhesive material 20, .e.g., a die attach paste, is dispensed into the first recess 14. The IC chip or die 18 is then mounted into the first recess 14, as show in FIG. 5C, using traditional pick and place techniques. Of course, if desired, the IC chip 18 could be secured in the first recess 14 using an adhesive tape.

Figure 5D:
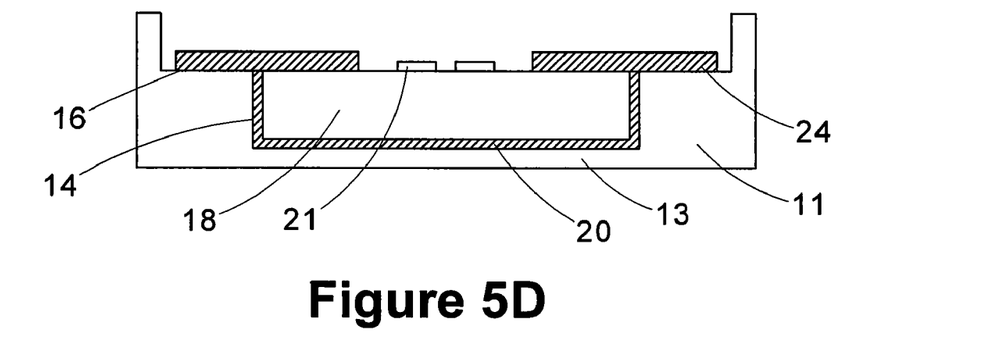
Figure 5E:
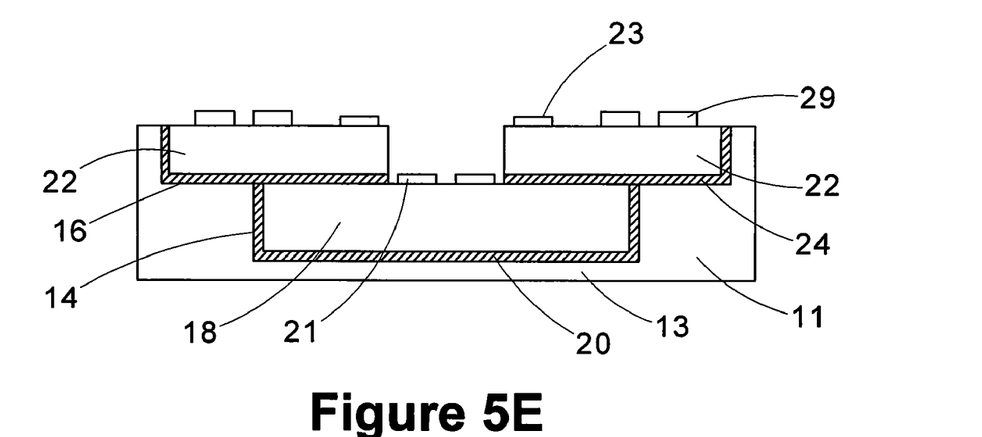

Next, as shown in FIG. 5D, additional adhesive material 24, e.g., adhesive paste, is positioned above the IC chip 18 and in the second recess 16. Then, as shown in FIG. 5E, the substrate 22 is positioned within the second recess 16 and attached to the adhesive material 24 using known techniques.

Figure 5F:
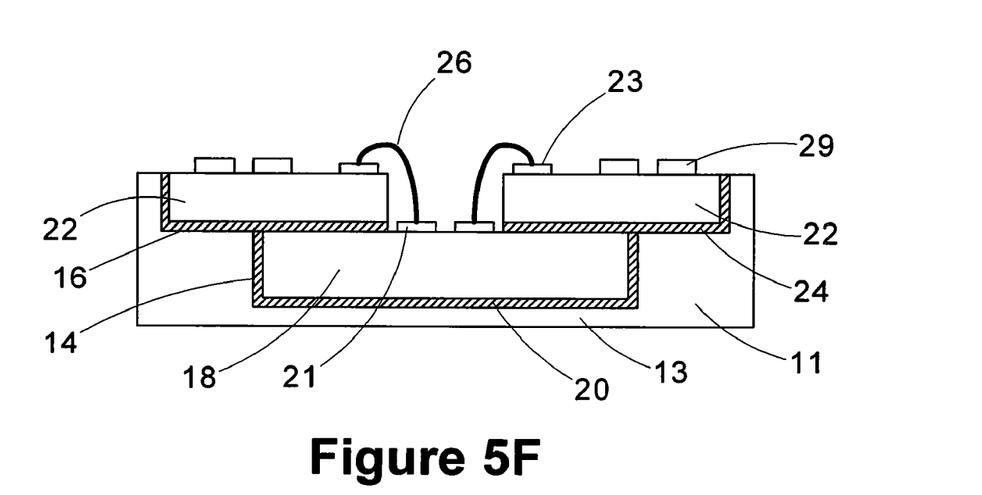

Thereafter, as shown in FIG. 5F, wire bonds 26 are conductively coupled to the bond pads 21 (on the IC chip 18) and bond pads 23 (on the substrate 22) to conductively couple the substrate 22 to the IC chip 18. The wire bonds 26 may be attached using a variety of known attachment techniques and materials. Note that the substrate 22 is provided with a wire bond slot 37 (see FIG. 4) to enable the attachment of the wire bonds 26.

Figure 5G:
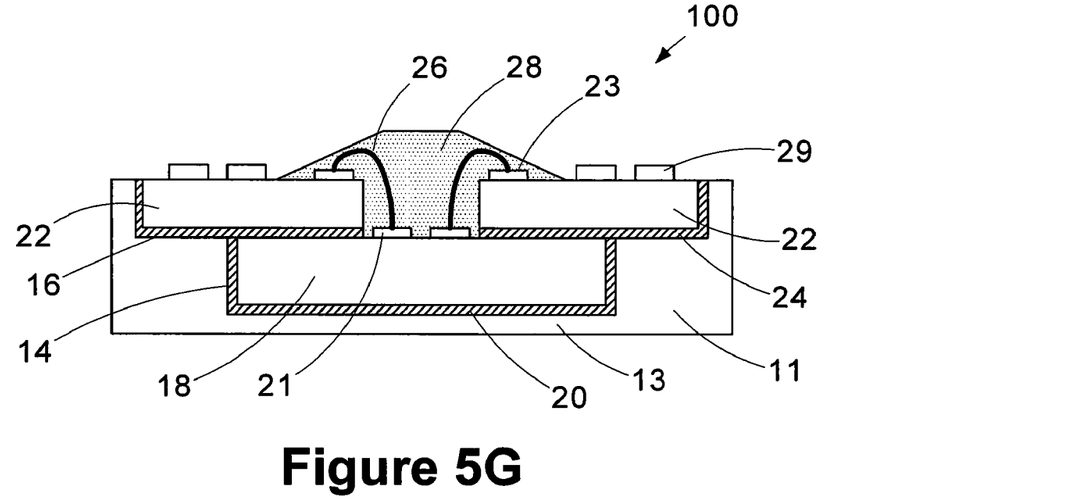

Next, as shown in FIG. 5G, an encapsulant material 28, e.g., epoxy, is formed to cover the wire bonds 26 and the bond pads 21, 23. The encapsulant material 28 may be formed by a variety of known techniques and it may be formed using a variety of known techniques.

Figure 5H:
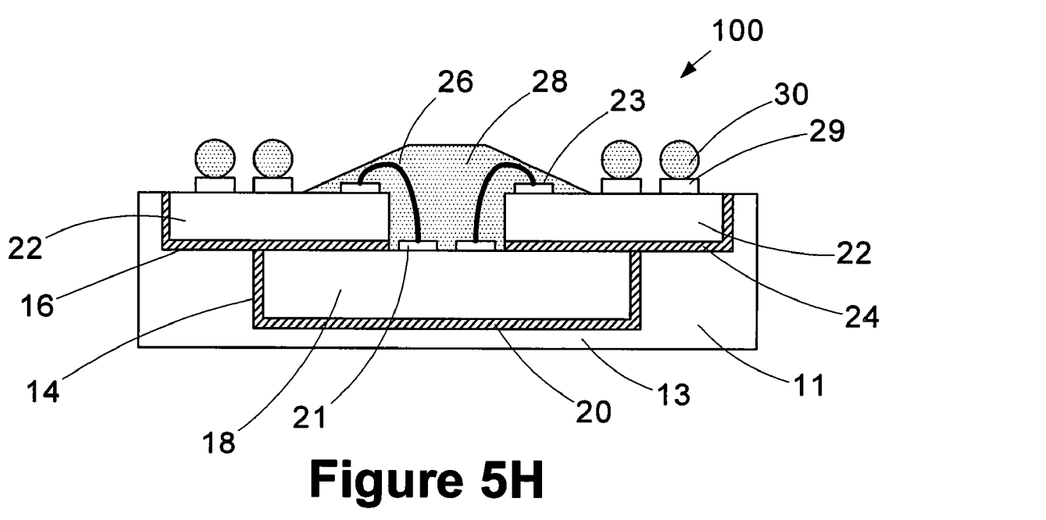
Figure 5I:
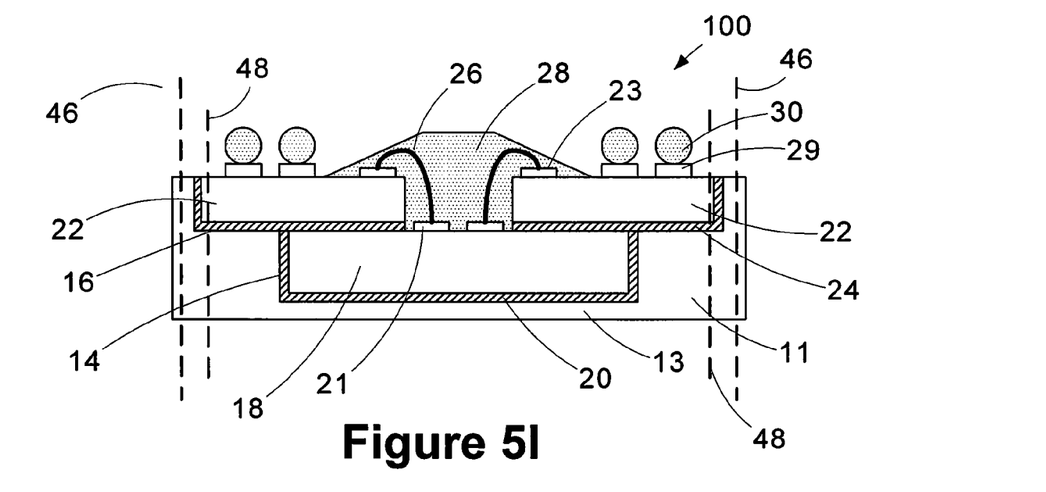
Figure 7:
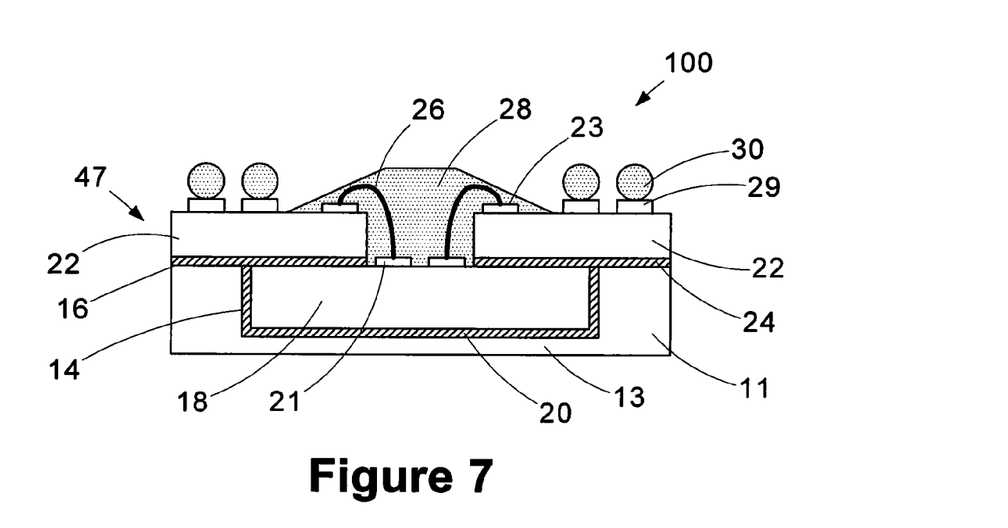
FIG. 7 is a cross-sectional view of a packaged integrated circuit device after it has been trimmed in accordance with another aspect of the present invention.

Thereafter, as shown in FIG. 5H, the bond pads 29 on the substrate 22 are exposed and solder balls 30 are formed on the bond pads 29 using traditional techniques. The structure depicted in FIG. 5H may now be trimmed to the final desired package size. For example, as shown in FIG. 5I, the packaged device may be trimmed along line 46 wherein the body 11 is along the exposed edge 47 of the packaged integrated circuit device 100, as shown in FIG. 3. Alternatively, the packaged device 100 may be trimmed along the lines 48, in which case the substrate 22 is on the exposed edge 47 of the device 100, as shown in FIG. 7.

As an alternative, the IC chip 18 and the substrate 22 may be pre-assembled or coupled together to form a pre-assembled unit. Thereafter, that pre-assembled unit may be positioned and secured within the pocket 12 of the premolded body 11.

Use of the present invention may provide many significant benefits. For example, the present invention may reduce warpage as compared to packaging methodologies employing organic substrates. The premolded carrier 10 depicted herein is relatively rigid and flat, thus enabling the carrier 10 to endure the rigors of the packaging process. Using the present technique, the thickness 15 of the mold cap 13 may be reduced as compared to prior art packaging designs, thereby resulting in a thinner packaged integrated circuit device which occupies less space. The carrier 10 can be formed with a larger number of pockets 12, thereby resulting in less mold cleaning operations and reduced mold waste. Since the premold pocket 12 is employed, there will be less loss due to encapsulant formation activities as only the wire bond slot 37 may require transfer or injection molding. At least some of these and other benefits may be obtained through use of the present invention.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A packaged integrated circuit device, comprising:
   a preformed body having a first recess and a second recess, the second recess being positioned above the first recess;
   an integrated circuit chip in the first recess of the preformed body, the integrated circuit chip having an active surface facing out of the first recess;
   a substrate positioned in the second recess of the preformed body, the substrate having an active surface facing out of second recess, the substrate having a slot; and
   wire bonds extending through the slot of the substrate, the wire bonds conductively coupled to the integrated chip and the substrate.

2. The device of claim 1, wherein the preformed body comprises at least one of an epoxy and a molding compound.

3. The device of claim 1, wherein the integrated circuit chip and the substrate are secured within the body by an adhesive material.

4. The device of claim 3, wherein the adhesive material comprises at least one of adhesive paste and adhesive tape.

5. The device of claim 1, wherein the preformed body comprises a first recess and a second recess, wherein the integrated circuit chip is positioned in the first recess and the substrate is positioned in the second recess.

6. The device of claim 1, wherein the integrated circuit chip is at least one of a memory chip, a microprocessor and an application specific integrated circuit device.

7. The device of claim 1, wherein the substrate is at least one of a printed circuit board, an interposer and a flex tape.

8. The device of claim 1, further comprising an encapsulant material positioned around the plurality of wire bonds.

9. The device of claim 1, wherein the plurality of wire bonds extend through an opening formed in the substrate.

10. The device of claim 1, wherein the substrate is positioned above the integrated circuit chip.

11. A packaged integrated circuit device, comprising:
    a preformed body comprising a first recess and a second recess;
    an integrated circuit chip positioned in the first recess, integrated circuit having an active surface facing away from the performed body;
    a substrate positioned in the second recess, the substrate having a slot and an active side facing away from the preformed body; and
    a plurality of wire bonds extending through the slot, the wire bonds conductively coupled to the integrated circuit chip and the substrate.

12. The device of claim 11, wherein the preformed body comprises at least one of an epoxy and a molding compound.

13. The device of claim 11, wherein the integrated circuit chip and the substrate are secured within the first and second recesses by an adhesive material.

14. The device of claim 13, wherein the adhesive material comprises at least one of adhesive paste and adhesive tape.

15. The device of claim 11, wherein the integrated circuit chip is at least one of a memory chip, a microprocessor and an application specific integrated circuit device.

16. The device of claim 11, wherein the substrate is at least one of a printed circuit board, an interposer and a flex tape.

17. The device of claim 11, further comprising an encapsulant material positioned around the plurality of wire bonds.

\* \* \* \* \*

UNITED STATES PATENT AND TRADEMARK OFFICE
CERTIFICATE OF CORRECTION

PATENT NO. : 8,217,508 B2  Page 1 of 1
APPLICATION NO. : 12/704423
DATED : July 10, 2012
INVENTOR(S) : Tan Kwang Hong

It is certified that error appears in the above-identified patent and that said Letters Patent is hereby corrected as shown below:

In column 6, line 16, in Claim 1, before "second" insert -- the --.

In column 6, line 44, in Claim 11, before "integrated" insert -- the --.

In column 6, line 45, in Claim 11, delete "performed" and insert -- preformed --, therefor.

Signed and Sealed this
Twenty-eighth Day of August, 2012

David J. Kappos
*Director of the United States Patent and Trademark Office*